(12) United States Patent
Onal et al.

(10) Patent No.: US 12,155,000 B2
(45) Date of Patent: *Nov. 26, 2024

(54) MONOLITHIC SILICON PHOTOMULTIPLIER ARRAY

(71) Applicant: Waymo LLC, Mountain View, CA (US)

(72) Inventors: Caner Onal, Palo Alto, CA (US); Pierre-Yves Droz, Mountain View, CA (US); Nirav Dharia, Milpitas, CA (US)

(73) Assignee: Waymo LLC, Mountain View, CA (US)

( * ) Notice: Subject to any disclaimer, the term of this patent is extended or adjusted under 35 U.S.C. 154(b) by 577 days.

This patent is subject to a terminal disclaimer.

(21) Appl. No.: 17/475,010

(22) Filed: Sep. 14, 2021

(65) Prior Publication Data

US 2022/0052217 A1 Feb. 17, 2022

Related U.S. Application Data

(63) Continuation of application No. 16/577,035, filed on Sep. 20, 2019, now Pat. No. 11,145,778.

(51) Int. Cl.
*H01L 31/107* (2006.01)
*G01S 7/481* (2006.01)
(Continued)

(52) U.S. Cl.
CPC ............ *H01L 31/107* (2013.01); *G01S 7/481* (2013.01); *H01L 27/1443* (2013.01); *H01L 31/02327* (2013.01); *H01L 31/18* (2013.01)

(58) Field of Classification Search
CPC .............. H01L 31/107; H01L 27/1443; H01L 31/02327; H01L 31/18; G01S 7/481
See application file for complete search history.

(56) References Cited

U.S. PATENT DOCUMENTS 8,975,607 B2 3/2015 Renna et al.
9,178,100 B2 11/2015 Webster et al.
(Continued)

FOREIGN PATENT DOCUMENTS

JP H11127390 5/1999
WO 2012/168218 12/2012
(Continued)

OTHER PUBLICATIONS

Japanese Patent Office, Office Action mailed Jun. 28, 2023, issued in connection with Japanese Patent Application No. 2022-516377, 24 pages.
(Continued)

*Primary Examiner* — Kevin K Pyo
*Assistant Examiner* — Don J Williams
(74) *Attorney, Agent, or Firm* — McDonnell Boehnen Hulbert & Berghoff LLP (57) ABSTRACT

An optical system may include a substrate and a plurality of silicon photomultipliers (SiPMs) monolithically integrated with the substrate. Each SiPM may include a plurality of single photon avalanche diodes (SPADs). The optical system also includes an aperture array having a plurality of apertures. The plurality of SiPMs and the aperture array are aligned so as to define a plurality of receiver channels. Each receiver channel includes a respective SiPM of the plurality of SiPMs optically coupled to a respective aperture of the plurality of apertures.

18 Claims, 9 Drawing Sheets

(51) Int. Cl.
   *H01L 27/144*  (2006.01)
   *H01L 31/0232* (2014.01)
   *H01L 31/18*   (2006.01)

(56) References Cited

U.S. PATENT DOCUMENTS

| | | |
|---|---|---|
| 9,831,283 B2 | 11/2017 | Shepard et al. |
| 10,283,541 B2 | 5/2019 | Siegert et al. |
| 11,145,778 B2 * | 10/2021 | Onal .................. H01L 31/18 |
| 2009/0184384 A1 | 7/2009 | Sanfilippo et al. |
| 2011/0147567 A1 | 6/2011 | Grazioso et al. |
| 2011/0248175 A1 | 10/2011 | Frach et al. |
| 2012/0112083 A1 | 5/2012 | Zhang et al. |
| 2017/0031010 A1 | 2/2017 | Suzuki et al. |
| 2019/0041498 A1 | 2/2019 | Droz et al. |
| 2019/0072649 A1 | 3/2019 | Droz et al. |
| 2019/0146070 A1 | 5/2019 | Hansson |

FOREIGN PATENT DOCUMENTS

| | | |
|---|---|---|
| WO | 2018/213200 | 11/2018 |
| WO | 2019/138923 | 7/2019 |

OTHER PUBLICATIONS

European Patent Office, Extended European Search Report mailed on Jul. 18, 2023, issued in connection with European Patent Application No. 20866546.3, 8 pages.

International Searching Authority, International Search Report and Written Opinion mailed on Dec. 29, 2020, issued in connection with International Patent Application No. PCT/US2020/051370 filed on Sep. 18, 2020, 10 pages.

China National Intellectual Property Administrations, First Office Action mailed on Jun. 27, 2024, issued in connection with Chinese Patent Application No. 202080065868.3, 15 pages (with English Translation).

* cited by examiner

MONOLITHIC SILICON PHOTOMULTIPLIER ARRAY

CROSS-REFERENCE TO RELATED APPLICATION

The present application is a continuation of U.S. patent application Ser. No. 16/577,035, filed Sep. 20, 2019, the content of which is herewith incorporated by reference.

BACKGROUND

Optical systems (e.g., LIDAR devices) may include several elements, such as light sources, optical elements, and/or photodetectors disposed within a common package. Furthermore, some elements of an optical system may be coupled to a common substrate.

SUMMARY

The present disclosure generally relates to optical systems (e.g., LIDAR systems) and certain aspects of their associated receiver subsystems.

In a first aspect, an optical system is provided. The optical system includes a substrate and a plurality of silicon photomultipliers (SiPMs) monolithically integrated with the substrate. Each SiPM includes a plurality of single photon avalanche diodes (SPADs). The optical system also includes an aperture array having a plurality of apertures. The plurality of SiPMs and the aperture array are aligned so as to define a plurality of receiver channels. Each receiver channel includes a respective SiPM of the plurality of SiPMs optically coupled to a respective aperture of the plurality of apertures.

In a second aspect, a method of manufacturing an optical system is provided. The method includes providing a monolithic SiPM array having a plurality of silicon photomultipliers (SiPMs) monolithically integrated with a substrate. Each SiPM includes a plurality of single photon avalanche diodes (SPADs). The method additionally includes aligning an aperture array having a plurality of apertures with the monolithic SiPM array so as to define a plurality of receiver channels. Each receiver channel includes a respective SiPM of the plurality of SiPMs optically coupled to a respective aperture of the plurality of apertures.

Other aspects, embodiments, and implementations will become apparent to those of ordinary skill in the art by reading the following detailed description, with reference where appropriate to the accompanying drawings.

DETAILED DESCRIPTION

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting.

Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

An optical system (e.g., a LIDAR device) could include a plurality of receiver channels. In example scenarios, each receiver channel includes a pinhole aligned over a discrete silicon photomultiplier (SiPM). The pinhole can reduce detection of ambient light. Each SiPM includes a plurality of (e.g., over 2000) single photon avalanche diodes (SPADs) electrically-connected together (e.g., connected in parallel). A SPAD is a single-photon sensitive device that is designed to operate in Geiger mode. In some embodiments, an optical system could include over 200 receiver channels (arranged in two groups of over 100 receiver channels each). In such cases, fabrication of the plurality of receiver channels may involve mounting over 200 individual SiPMs to one or more printed circuit boards (PCBs).

Fabrication of the optical system can be improved by providing a monolithic SiPM array in which multiple SiPMs are formed on a single substrate (e.g., a silicon wafer). Each SiPM on the substrate can fill up a circular area that includes the same number of electrically-connected SPADs as is used (e.g., over 2000 per SiPM). In such a scenario, if the circular SiPMs are arranged in a hexagonal or square array with a density of between 0.2 and 0.6 SiPMs per $mm^2$ (e.g., about 0.4 SiPMs per $mm^2$), it may be feasible to fit about 200 SiPMs on a 1-inch diameter silicon wafer. In this way, four silicon substrates with respective monolithic SiPM arrays could be utilized to provide a comparable number of SiPMs as that used in the contemporary optical system design.

With multiple SiPMs monolithically integrated onto the same substrate, it is desirable to include structures that provide electrical and/or optical isolation between SiPMs (e.g., to reduce cross-talk between adjacent SiPMs). In one approach, each SiPM may be surrounded by a deep trench in the substrate that is filled in with a metal or another optically opaque, conductive, and/or non-conductive material. The filled trenches can block photo-generated electrons from a SiPM from reaching an adjacent SiPM (electrical isolation) and can also block photons from a SiPM from reaching an adjacent SiPM (optical isolation). To provide additional optical isolation, a baffle structure can be positioned between the monolithic SiPM array and its corresponding pinhole array. In one approach, the baffle structure can include an array of holes drilled or otherwise formed in an opaque material (e.g., metal or plastic), with each hole defining an optical path between a pinhole and its corresponding SiPM in the monolithic SiPM array. Further, each hole can have a diameter that matches the diameter of the SiPM. The baffle structure can be attached to the monolithic SiPM array with the array of holes aligned with the array of SiPMs, and the pinhole array can be attached to the baffle structure so that the pinholes are centered over the holes. With this configuration, the light received through each pinhole can reach the corresponding SiPM through the corresponding hole in the baffle structure but is blocked by the opaque material from reaching adjacent SiPMs.

Electrical contacts for the monolithic array can be provided in different ways. In one approach, electrical contacts could be provided on the backside of the substrate. Alternatively, electrical contacts could be provided from the side and/or routed along a top surface of the substrate.

Other aspects, embodiments, and implementations will become apparent to those of ordinary skill in the art by reading the following detailed description, with reference where appropriate to the accompanying drawings.

II. Example Systems

Figure 1:
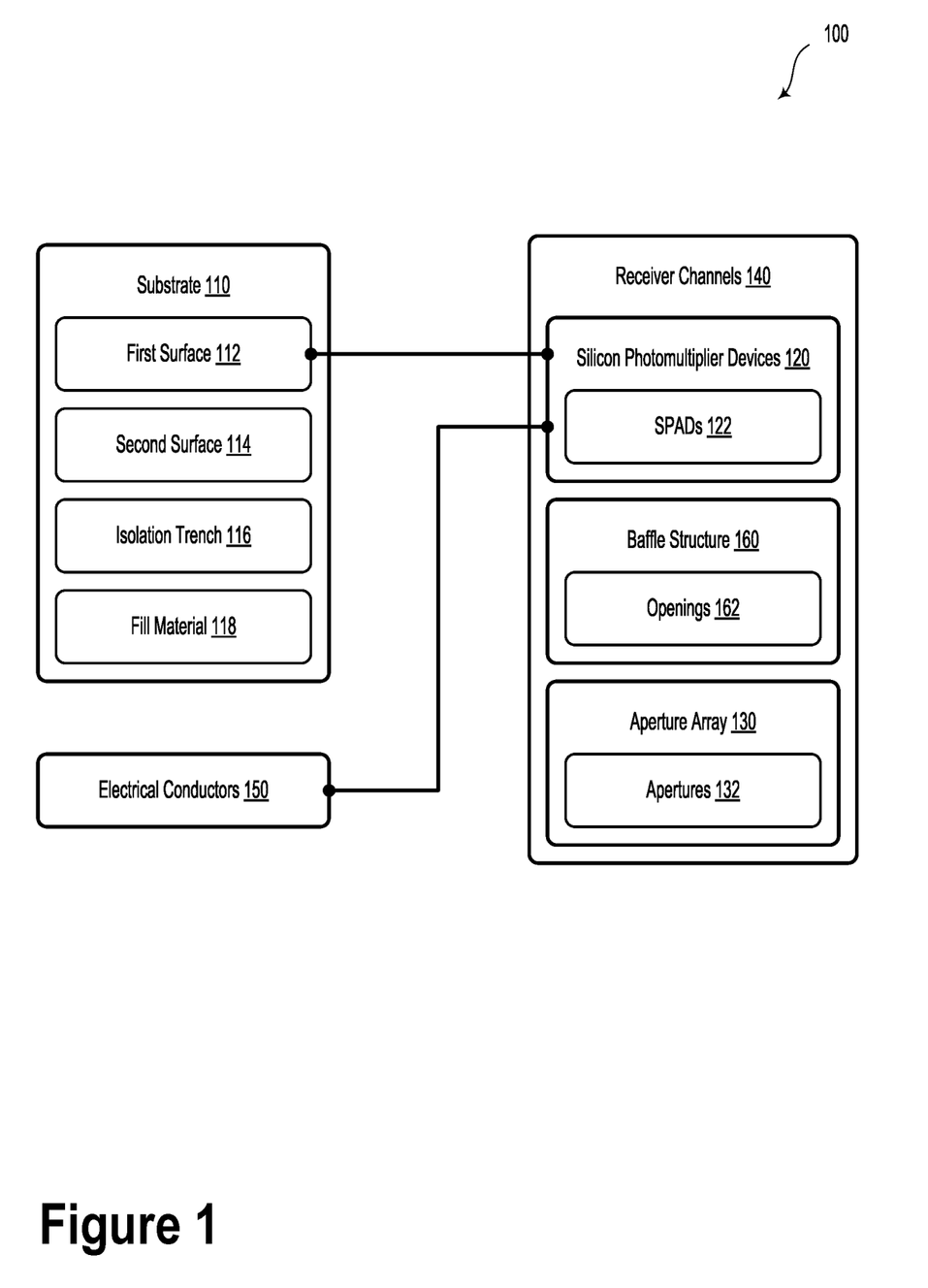
FIG. 1 illustrates a schematic block representation of an optical system, according to an example embodiment.

FIG. 1 illustrates a schematic block representation of an optical system 100, according to an example embodiment. In some cases, optical system 100 could be utilized as a portion of a LIDAR system, such as a receiver subsystem of the LIDAR system. The LIDAR system may be coupled to a vehicle and used in the operation of the vehicle, such as when the vehicle is in an autonomous or semi-autonomous mode or when the vehicle is a fully autonomous vehicle. A vehicle may be, for example, a car, truck, tractor-trailer, construction equipment such as bulldozers, an autonomous drone aircraft, or a robot such as a sidewalk delivery robot. Such LIDAR systems may be configured to provide information (e.g., point cloud data) about one or more objects (e.g., location, shape, etc.) in a given environment. In an example embodiment, the LIDAR system could provide point cloud information, object information, mapping information, or other information to a vehicle. Other types of vehicles and LIDAR systems are contemplated herein.

The optical system 100 includes a substrate 110, which includes a first surface 112 and a second surface 114.

In some examples, the substrate 110 could be approximately 200 microns thick. For instance, the substrate 110 could have a thickness of between 100 to 500 microns. However, other thicknesses are possible and contemplated. In some embodiments, the substrate 110 could include a semiconductor substrate material such as a silicon substrate (e.g., a silicon wafer), an indium phosphide substrate (e.g., an indium phosphide wafer), a gallium arsenide substrate (e.g., a GaAs wafer), or the like. In an example embodiment, the substrate 110 could include a silicon germanium-on-silicon substrate. In some embodiments, the substrate 110 could include a silicon-on-insulator (SOI) material. Alternatively, the substrate 110 could be formed from a variety of other solid and/or flexible materials, each of which is contemplated in the present disclosure.

The optical system 100 includes a plurality of silicon photomultiplier (SiPM) devices 120 that are monolithically integrated with the substrate 110. Each of the SiPM devices 120 may constitute a plurality of single photon avalanche diodes (SPADs) 122. For example, each SiPM of the plurality of SiPMs 120 could include at least 1000 SPADs 122. It will be understood that more or less SPADs 122 could be associated with each SiPM of the plurality of SiPMs 120.

In some embodiments, the plurality of SiPMs 120 could be arranged along the substrate in a hexagonal or square array. That is, each SiPM of the plurality of SiPMs 120 could be arranged at a respective lattice point of a hexagonal, triangular, or a square lattice. Other close-packing arrangements of the respective SiPMs in the plurality of SiPMs 120 are possible and contemplated. In some embodiments, the SiPMs of the plurality of SiPMs are arranged along the substrate with a density of between 0.2 to 0.6 SiPMs per $mm^2$ (e.g., about 0.4 SiPMs per $mm^2$). It will be understood that higher or lower densities of SiPMs per $mm^2$ are contemplated and possible. While SiPMs are described in relation to some embodiments of the present disclosure, other types of photo-sensitive detector devices are possible.

The optical system 100 further includes an aperture array 130, which includes a plurality of apertures 132. The plurality of SiPM devices 120 and the aperture array 130 are aligned so as to define a plurality of receiver channels 140. In such scenarios, each receiver channel 140 includes a respective SiPM of the plurality of SiPM devices 120 being optically coupled to a respective aperture of the plurality of apertures 132.

In some embodiments, the optical system 100 includes a plurality of electrical conductors 150. For example, the plurality of electrical conductors may be coupled to the plurality of SiPMs 120 via at least one of: a through substrate via (TSV) or a side routing arrangement. Other ways to route the electrical conductors 150 are contemplated and possible. For example, the plurality of electrical conductors 150 could be connected to other circuitry by way of a top-level wire bond connection. Additionally or alternatively, the electrical conductors 150 could be routed along spaces between the SiPM devices 120 (e.g., in the "streets" between SiPM devices).

Furthermore, the optical system 100 includes isolation trenches 116. The isolation trenches 116 could be located in the substrate 110. In some embodiments, the isolation trenches 116 could be arranged between neighboring SiPMs of the plurality of SiPM devices 120. At least one of the isolation trenches 116 may be at least partially filled with fill material 118. For example, the at least one isolation trench 116 could be at least partially filled with at least one of: a metal material, an optically-opaque material, a conductive material, or a non-conductive material. In such scenarios, the at least one isolation trench 116 provides electrical isolation between the neighboring SiPMs of the plurality of SiPM devices 120.

Additionally or alternatively, in some embodiments, the at least one isolation trench 11 could provide optical isolation between the neighboring SiPMs of the plurality of SiPM devices 120.

In some embodiments, the optical system 100 includes a baffle structure 160. The baffle structure 160 includes a plurality of openings 162 in an optically opaque material. In such scenarios, the baffle structure 160 is arranged between the aperture array 130 and the plurality of SiPMs 120 such that each receiver channel 140 includes a respective SiPM of the plurality of SiPMs 120 that is optically coupled to a respective aperture of the plurality of apertures 132 via a respective opening in the baffle structure 160.

In some embodiments, a cross-section of the baffle structure 160 could include a plurality of diamond-shaped members separated by the respective openings in the baffle structure 160.

Figure 2A:
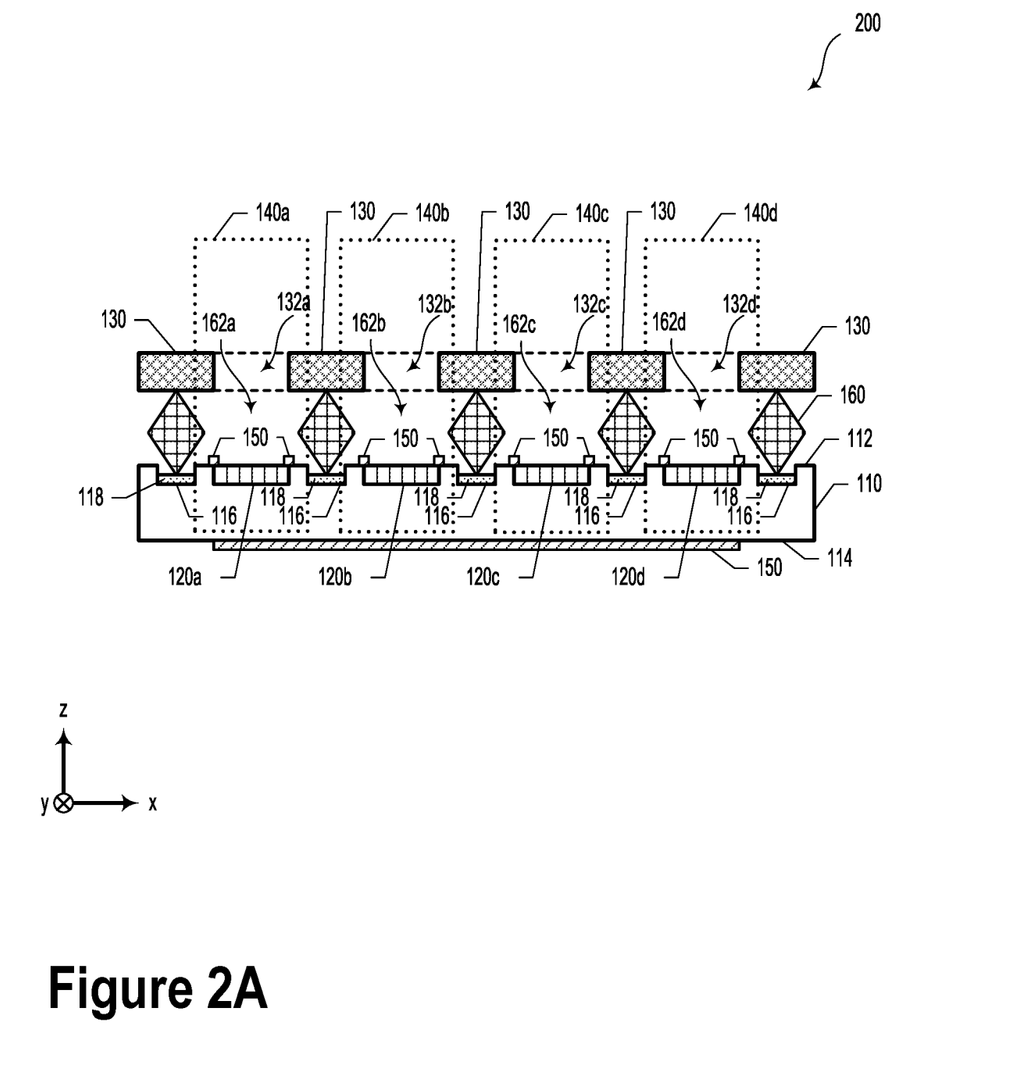
FIG. 2A illustrates a cross-sectional view of an optical system, according to an example embodiment.

FIG. 2A illustrates a cross-sectional view of an optical system 200, according to an example embodiment. FIG. 2A could include elements that are similar or identical to those of optical system 100 illustrated and described in reference to FIG. 1. FIG. 2A is meant to illustrate the general arrangement of the elements of optical system 200 and not necessarily meant to show the exact scale or proportion of such elements.

In some embodiments, the optical system 200 could include a substrate 110 with a first surface 112 and a second surface 114. As illustrated, the first surface 112 could be arranged opposite the second surface 114. As described elsewhere, substrate 110 could include a semiconductor substrate (e.g., a semiconductor wafer). For instance, the first surface 112 could include a top surface of a silicon wafer and the second surface 114 could include a bottom surface of the silicon wafer.

As illustrated in FIG. 2A, the optical system 200 could include a plurality of silicon photomultiplier (SiPM) devices 120 (e.g., SiPMs 120a, 120b, 120c, and 120d) that are monolithically integrated with the substrate 110. That is, the SiPMs 120a, 120b, 120c, and 120d could be formed, at least in part, within the substrate 110. For example, the SiPMs 120a, 120b, 120c, and 120d could each include a plurality of SPADs. SPADs are semiconductor devices that include a p-n junction that is designed to operate when reverse-biased at a voltage $V_a$ greater than a breakdown voltage $V_B$ of the junction. For example, $V_a$ could be applied across the p-n junction, which could be approximately 1-5 microns thick, so as to provide an electric field greater than $3 \times 10^5$ V/cm. Other electric fields are possible and contemplated.

In some embodiments, the SPADs 122 could be configured to detect infrared light (e.g., 905 nm or 1550 nm). However, other wavelengths of light could be detected as well.

The SPADs 122 could be configured and/or biased so as to provide a milliampere or more of photocurrent in response to absorbing a single photon. Other configurations and/or photocurrents are possible and contemplated.

In some embodiments, the SPADs could include a passive or active quenching circuit. For example, the passive quenching circuit could include a resistor coupled in series with the SPAD. Additionally or alternatively, the active quenching circuit could include a fast discriminator circuit or a synchronous bias voltage reduction circuit.

In some embodiments, each SiPM of the plurality of SiPMs 120 could include at least 1000 SPADs 122. It will be understood that more or less SPADs 122 could be associated with each SiPM of the plurality of SiPMs 120.

In some embodiments, SiPMs 120a, 120b, 120c, and 120d could be separated by a respective plurality of isolation trenches 116. The isolation trenches 116 could be formed by utilizing a lithographically-defined wet or dry etch process. Other semiconductor manufacturing techniques to form the isolation trenches 116 are possible and contemplated. Some or all of the isolation trenches 116 could be filled, at least partially, by fill material 118.

As illustrated in FIG. 2A, electrical conductors 150 could be located along the first surface 112 (e.g., along a periphery of the respective SiPMs 120a, 120b, 120c, and 120d. Additionally or alternatively, electrical conductor 150 could be coupled to the second surface 114. It will be understood that electrical conductor 150 could be located in other positions so as to electrically couple the respective SiPMs 120a, 120b, 120c, and 120d to detection circuitry. Other ways to physically and/or electrically connect the respective SiPMs 120a, 120b, 120c, and 120d to detection circuitry are possible and contemplated, such as, without limitation, conventional solder balls, ball-grid arrays (BGA), land-grid arrays (LGA), conductive paste, and other types of physical and electrical sockets.

In some embodiments, the diamond-shaped members of the baffle structure 160 could be arranged so as to optically isolate the receiver channels 140a, 140b, 140c, and 140d from one another. For example, the baffle structure 160 could provide an opaque barrier between respective receiver channels. The diamond-shaped portions of the baffle structure 160 could be physically coupled between the fill material 118 and aperture array 130. Between the diamond-shaped portions of the baffle structure 160, light may be directed toward the respective SiPMs 120a, 120b, 120c, and 120d by way of the respective openings 162a, 162b, 162c, and 162d.

In example embodiments, the aperture array 130 could include apertures 132a-132d, which could each have an open diameter of 120-160 microns. However, other aperture diameters are possible and contemplated. The plurality of apertures 132a-132d could include holes drilled or lithographically etched through a material that is substantially opaque to light. In other embodiments, the plurality of apertures 132a-132d could include optical windows that are substantially transparent to light.

Additionally or alternatively, other ways are contemplated and possible to optically isolate adjacent SiPMs. For example, a reflective grid could be patterned along a top surface of the SiPMs. The reflective grid could be formed from metal or another optically opaque material. The reflective grid could be defined so as to align with the baffle structure 160 and/or the aperture array 130. In such a scenario, light falling between adjacent SiPM devices would not enter the silicon substrate. Such optical isolation could reduce inter-channel crosstalk at the potential expense of slightly reducing fill factor for a given SiPM array.

Furthermore, in some embodiments, the aperture array 130 and baffle structure 160 could be replaced by a combination aperture/baffle structure. Such a combination structure could include a thick opaque plate with deep holes, drilled or etched to correspond with SiPM device locations.

Figure 2B:
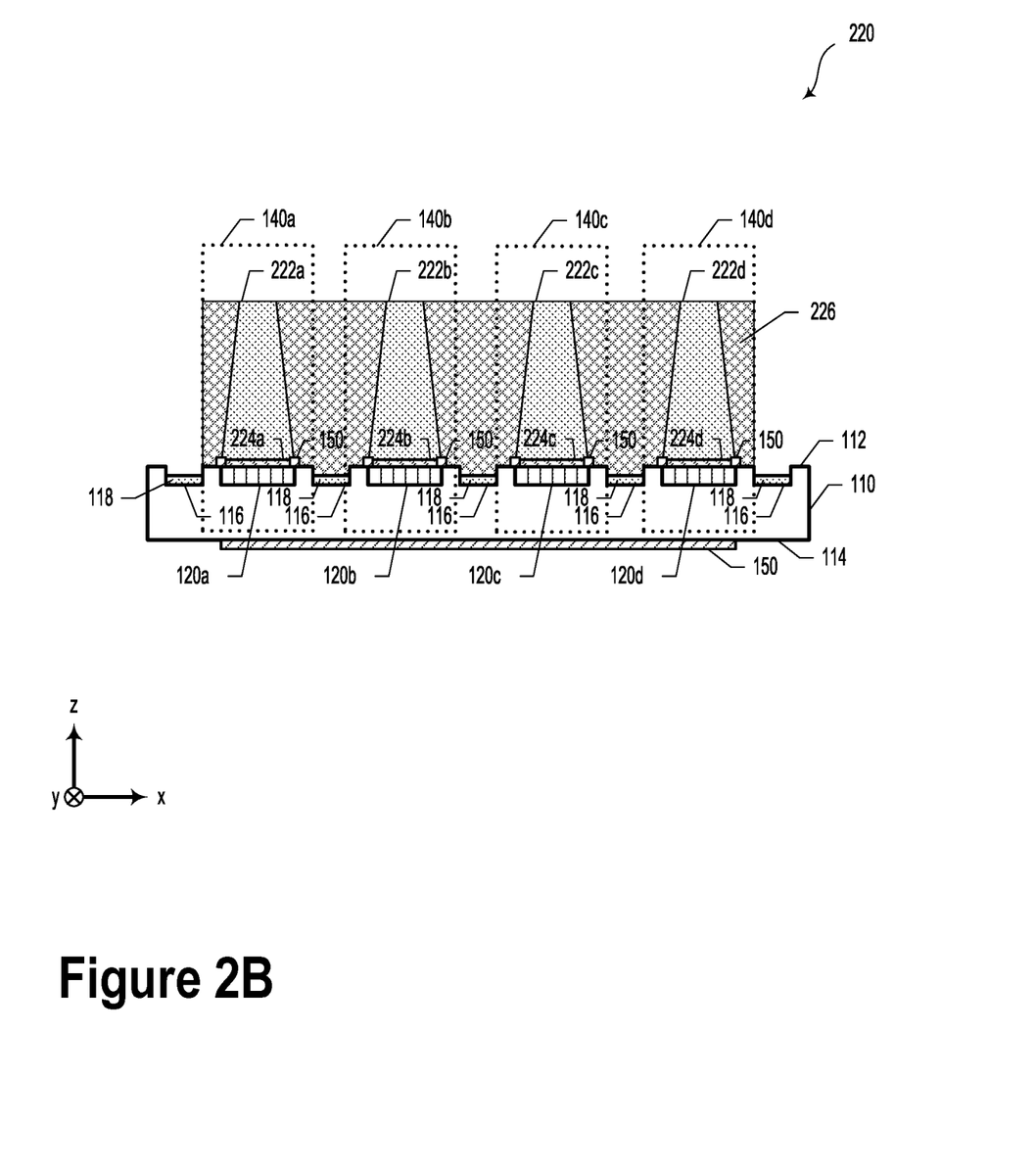
FIG. 2B illustrates a cross-sectional view of an optical system, according to an example embodiment.

In lieu of, or in combination with the aperture array 130 and baffle structure 160, some embodiments could include a set of vertical, optically-transparent pillars (e.g., optical waveguides) that may serve as a lightguide and couple light to the SiPM devices using total internal reflection. FIG. 2B illustrates a cross-sectional view of an optical system 220, according to an example embodiment. As illustrated in FIG. 2B, optical system 220 could include optical waveguides 222a, 222b, 222c, and 222d, which could be configured to guide light toward the respective SiPM devices 120a, 120b, 120c, and 120d. As illustrated, the optical waveguides 222a, 222b, 222c, and 222d could have a tapered shape. In other examples, the optical waveguides 222a, 222b, 222c, and 222d could have a straight sidewall and/or take on another shape. In some scenarios, an "active isolation region" could be defined by growing dielectric stacks 224a, 224b, 224c, and 224d over the respective SiPM devices 120a, 120b, 120c, and 120d. The dielectric stacks 224a, 224b, 224c, and 224d could be configured to couple light from the optical waveguides 222a, 222b, 222c, and 222d into the respective SiPM devices 120*a*, 120*b*, 120*c*, and 120*d*. In some embodiments, further optical isolation between SiPM devices 120*a*, 120*b*, 120*c*, and 120*d* could be achieved by etching the dielectric stack between SiPM devices and then filling the trenches with an organosiloxane-based planarizing material 226 (e.g., Silecs XC400L or the like). In some embodiments, the planarizing material 226 could have a high refractive index relative to the optical waveguides 222*a*, 222*b*, 222*c*, and 222*d* and/or the dielectric stacks 224*a*, 224*b*, 224*c*, and 224*d*.

Figure 2C:
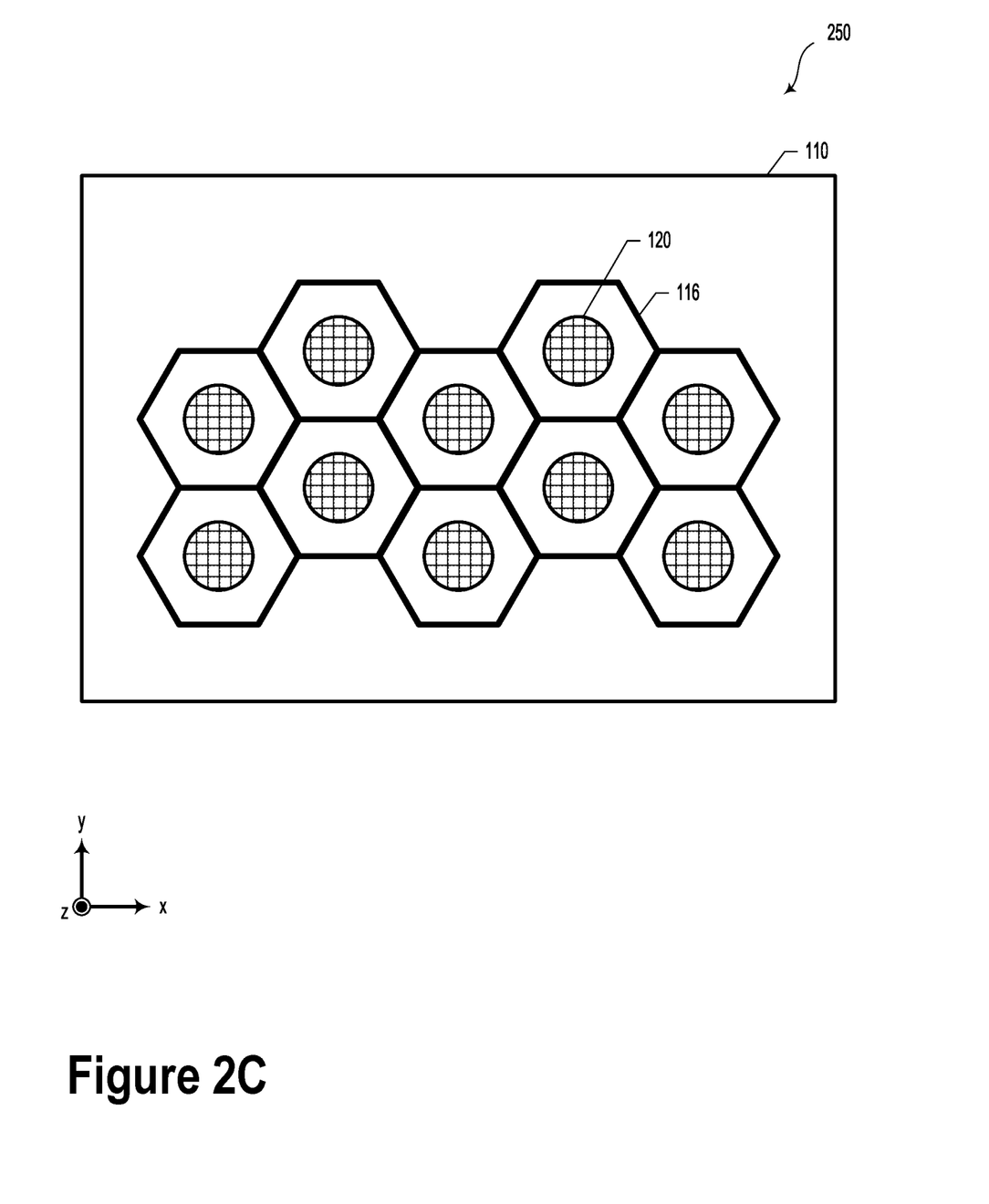
FIG. 2C illustrates a top view of an optical system, according to an example embodiment.

FIG. 2C illustrates a top view 250 of the optical system 200, according to an example embodiment. As illustrated in FIG. 2C, a plurality of SiPM devices 120 could be arranged in a hexagonal array along a surface of a substrate 110. Furthermore, the SiPM devices of the plurality of SiPM devices 120 could be electrically and/or optically isolated from one another by way of one or more isolation trenches 116. In some embodiments, the isolation trenches 116 could be filled with a fill material, as described herein.

It will be understood that various ways could be utilized to electrically and/or optically isolate SiPM devices from one another. For example, while FIG. 2C illustrates a regular hexagonal array, variable spacing and/or variable isolation depths could be utilized between respective receiver channels. For example, in reference to FIG. 2A, receiver channels 140*a*, 140*b*, 140*c*, and 140*d* could be isolated by trenches have a first depth (e.g., 1 micron) between some receiver channels and a second depth (e.g., 2 microns) between others. Furthermore, some receiver channels could be spaced further apart from some adjacent receiver channels than for others.

III. Example Methods

FIGS. 3A-3D illustrate various steps of a method of manufacture, according to one or more example embodiments. It will be understood that at least some of the various steps may be carried out in a different order than of that presented herein. Furthermore, steps may be added, subtracted, transposed, and/or repeated. FIGS. 3A-3D may serve as example illustrations for at least some of the steps or blocks described in relation to method 400 as illustrated and described in relation to FIG. 4. Additionally, some steps of FIGS. 3A-3D may be carried out so as to provide optical system 100 and/or optical systems 200 or 220, as illustrated and described in reference to FIGS. 1, 2A, and 2B, respectively.

Figure 3A:
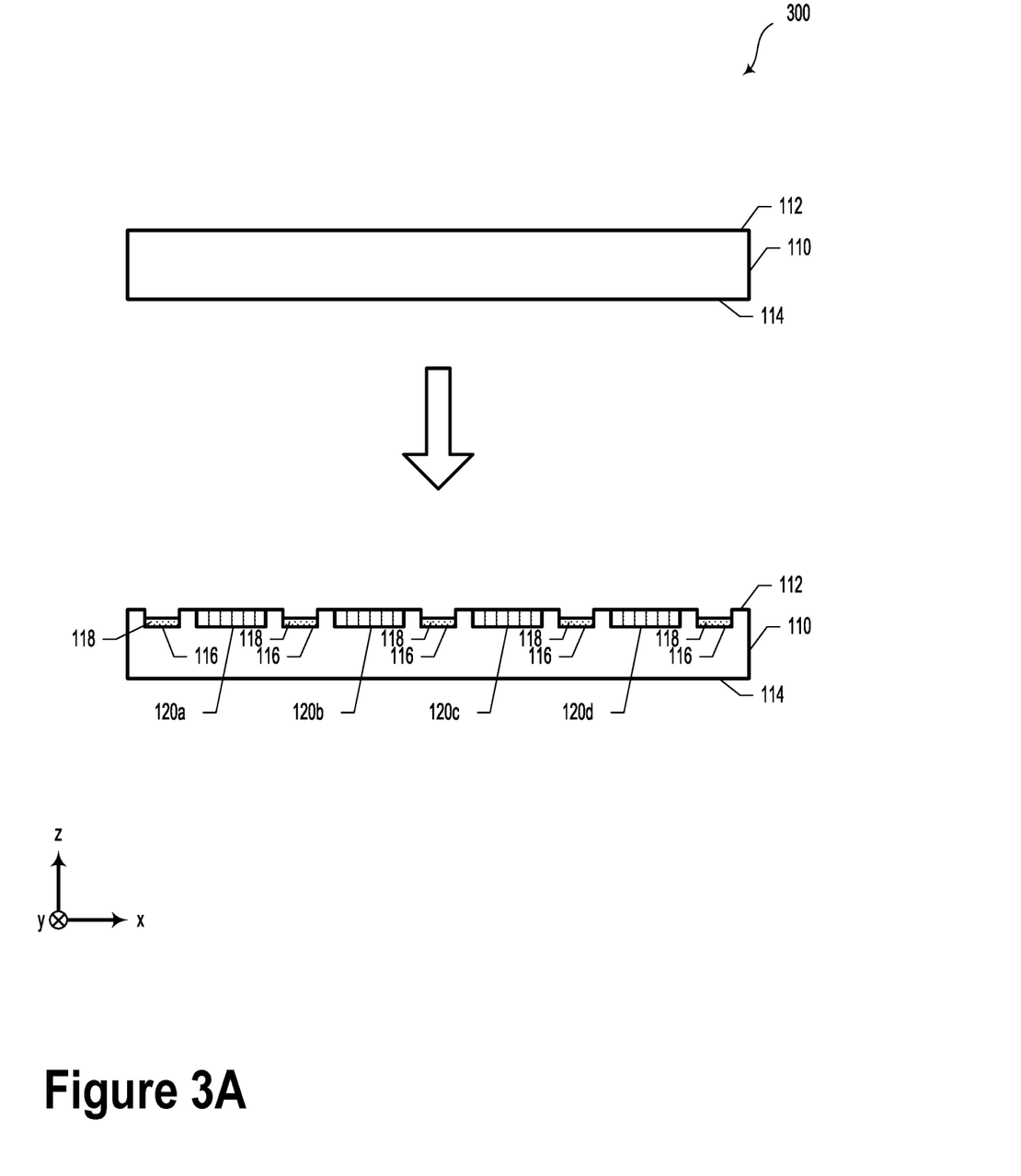
FIG. 3A illustrates a step of a method of manufacture, according to an example embodiment.

FIG. 3A illustrates a step of a method of manufacture 300, according to an example embodiment. Step 300 initially includes providing a substrate 110. The substrate 110 may include a first surface 112 and a second surface 114. The substrate 110 could include a semiconductor material, such as a silicon or silicon-on-insulator substrate.

Step 300 could subsequently include forming a plurality of SiPMs 120*a*, 120*b*, 120*c*, and 120*d*. In some embodiments, forming the plurality of SiPMs 120*a*, 120*b*, 120*c*, and 120*d* could include forming p-n junctions in the first surface 112. That is, the SiPMs 120*a*, 120*b*, 120*c*, and 120*d* could be monolithically integrated with the substrate 110. Each SiPM includes a plurality of single photon avalanche diodes (SPADs). In some embodiments, the plurality of SiPMs in the monolithic SiPM array could be arranged in a hexagonal or square array. In such scenarios, the plurality of SiPMs in the monolithic SiPM array could be arranged with a density of about 0.4 SiPMs per mm$^2$.

Step 300 could additionally include forming a plurality of isolation trenches 116 in the first surface 112 of the substrate 110. In some embodiments, forming the plurality of isolation trenches 116 could include etching into the first surface 112 with a wet or dry etch process. Additionally or alternatively, the isolation trenches 116 could be formed by grinding, polishing, or another mechanical method. In some embodiments, the isolation trenches 116 could be arranged between neighboring SiPMs.

Step 300 could further include filling at least a portion of the isolation trenches 116 with a fill material 118. The isolation trenches 116 could be at least partially filled with at least one of: a metal material, an optically-opaque material, a conductive material, or a non-conductive material. As an example, the fill material 118 could be deposited using a chemical vapor deposition process or an oxidation process. The at least one isolation trench could provide electrical isolation between the neighboring SiPMs. Additionally or alternatively, the at least one isolation trench could provide optical isolation between the neighboring SiPMs.

Figure 3B:
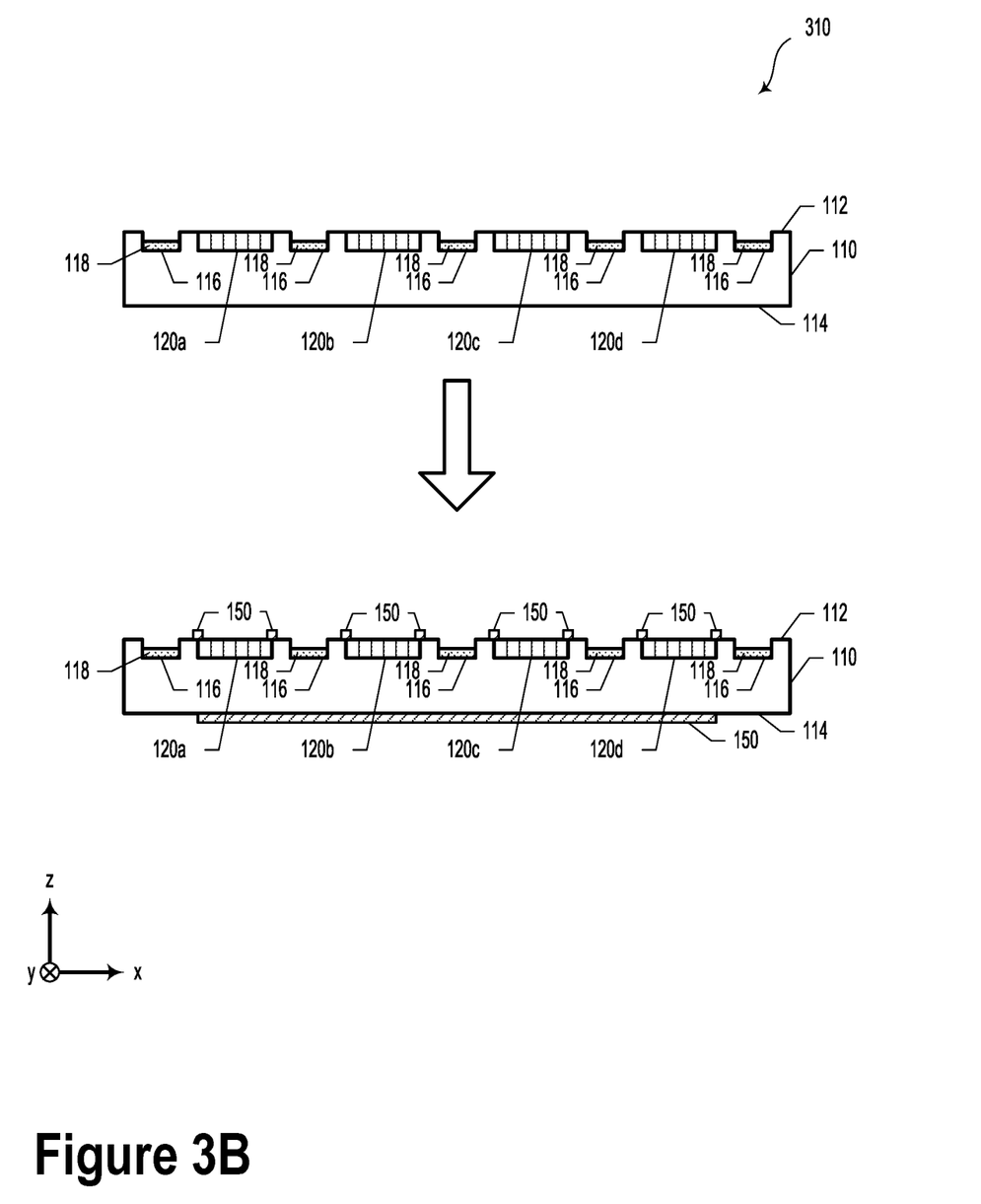
FIG. 3B illustrates a step of a method of manufacture, according to an example embodiment.

FIG. 3B illustrates a step of a method of manufacture 310, according to an example embodiment. Step 310 includes forming one or more electrical conductors 150 on a first surface 112 and/or a second surface 114 of the substrate 110. The electrical conductors 150 could provide electrical coupling between the SiPMs 120*a*, 120*b*, 120*c*, and 120*d* and respective detection circuitry.

Figure 3C:
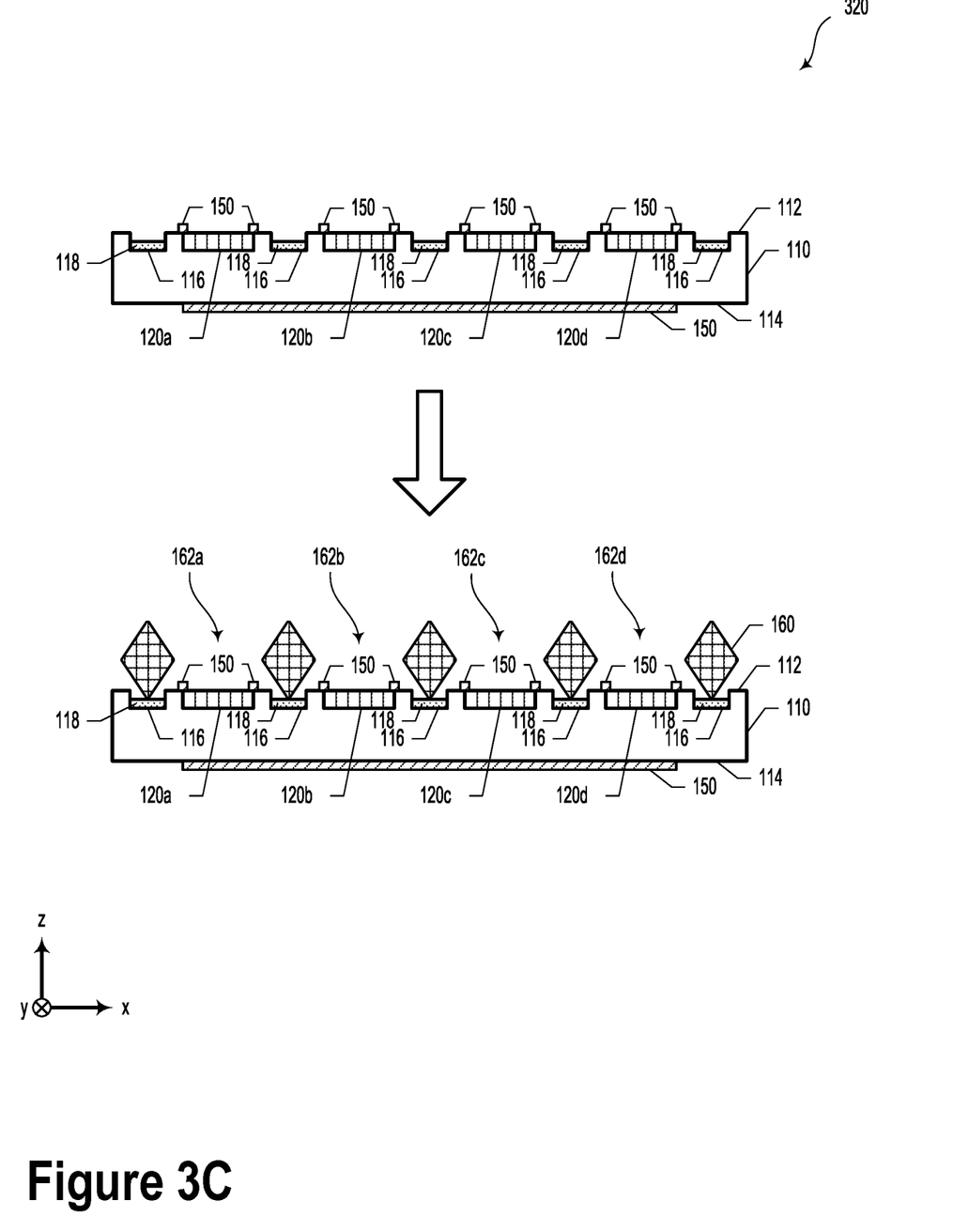
FIG. 3C illustrates a step of a method of manufacture, according to an example embodiment.

FIG. 3C illustrates a step of a method of manufacture 320, according to an example embodiment. Step 320 includes positioning a baffle structure 160 comprising a plurality of openings 162*a*, 162*b*, 162*c*, and 162*d* in an optically opaque material. The baffle structure 160 could be positioned so as to align a plurality of diamond-shaped structures with a plurality of isolation trenches 116 and/or the respective SiPMs 120*a*, 120*b*, 120*c*, and 120*d*.

In some embodiments, the baffle structure 160 could be positioned between the monolithic SiPM array 120*a*, 120*b*, 120*c*, and 120*d* and the aperture array 130, as described herein. In some embodiments, the baffle structure 160 could be positioned with a pick-and-place tool and could be aligned to underlying structures based on registration marks located along the first surface 112.

Figure 3D:
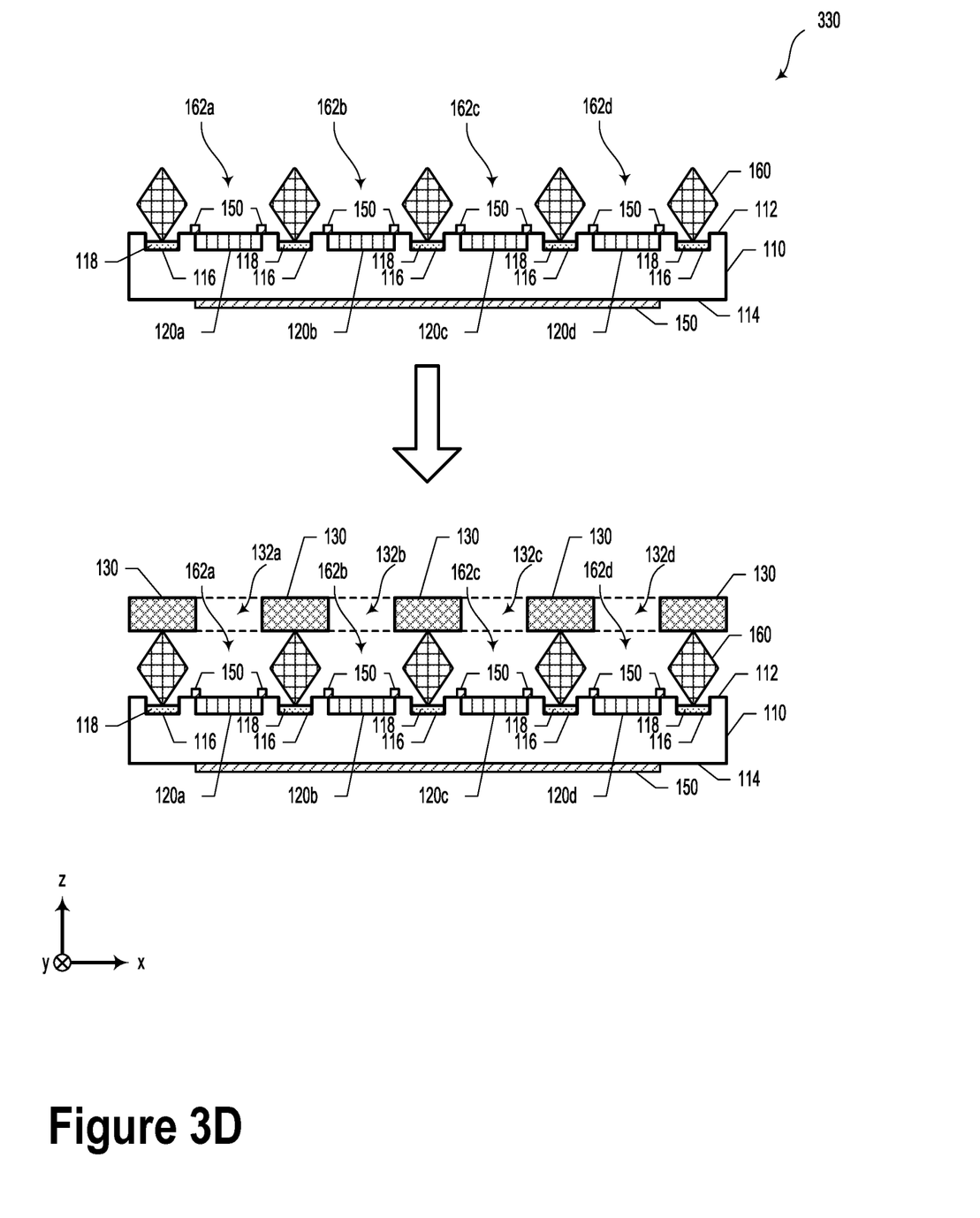
FIG. 3D illustrates a step of a method of manufacture, according to an example embodiment.

FIG. 3D illustrates a step of a method of manufacture 330, according to an example embodiment. Step 330 includes aligning an aperture array 130 with respect to the baffle structure 160 and/or the SiPMs 120*a*, 120*b*, 120*c*, and 120*d* so as to define a plurality of receiver channels (e.g., receiver channels 140*a*, 140*b*, 140*c*, and 140*d* as illustrated and described in reference to FIG. 2A). The aperture array 130 includes a plurality of apertures 132*a*, 132*b*, 132*c*, and 132*d*. Each receiver channel includes a respective SiPM of the plurality of SiPMs optically coupled to a respective aperture of the plurality of apertures and a respective opening in the baffle structure.

Figure 4:
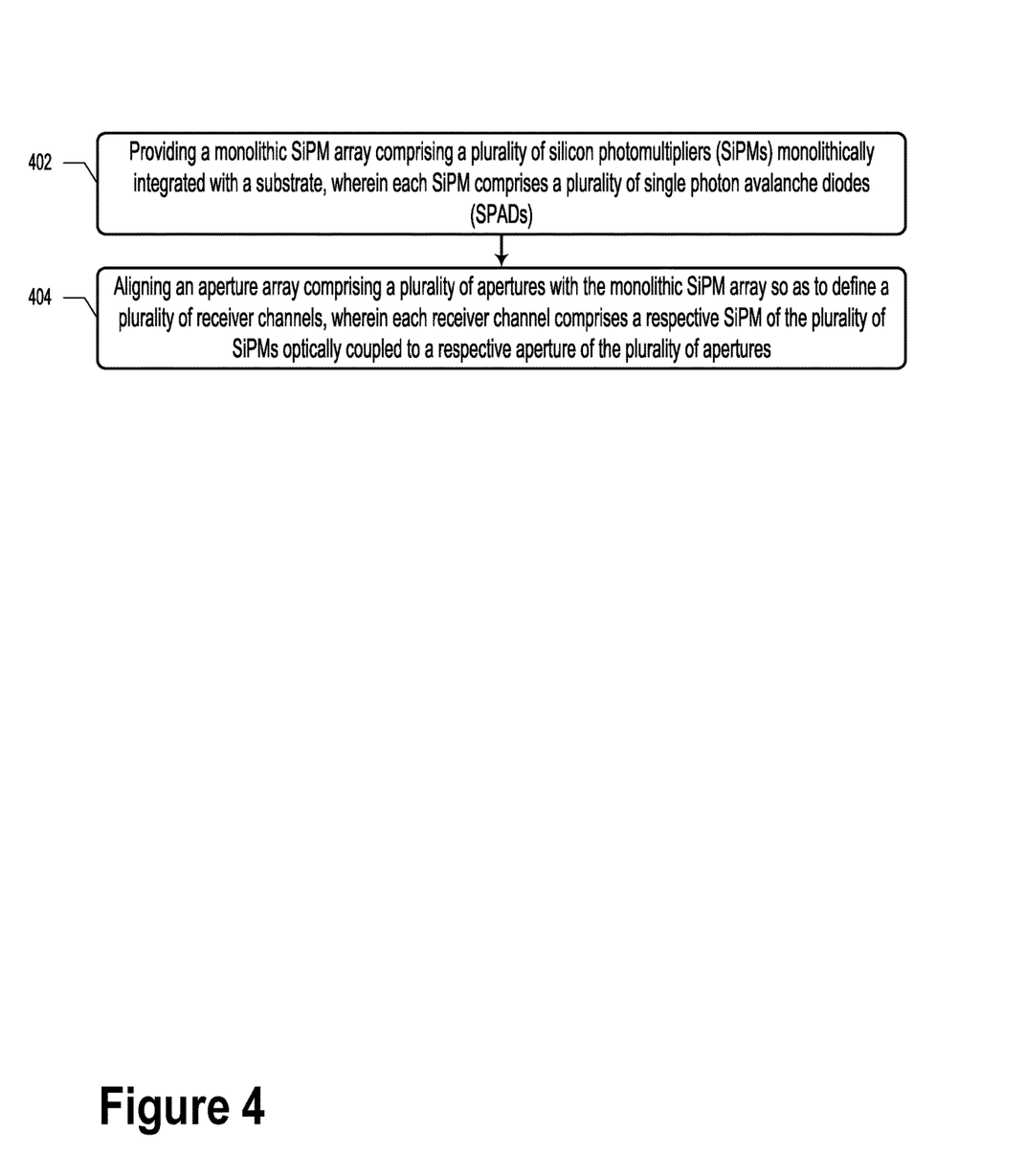
FIG. 4 illustrates a method, according to an example embodiment.

FIG. 4 illustrates a method 400, according to an example embodiment. Method 400 may be carried out, at least in part, by way of some or all of the manufacturing steps or stages illustrated and described in reference to FIGS. 3A-3D. It will be understood that the method 400 may include fewer or more steps or blocks than those expressly disclosed herein. Furthermore, respective steps or blocks of method 400 may be performed in any order and each step or block may be performed one or more times. In some embodiments, method 400 and its steps or blocks may be performed to provide an optical system that could be similar or identical to optical system 100 and/or optical system 200, as illustrated and described in reference to FIGS. 1 and 2.

Block 402 includes providing a monolithic SiPM array that includes a plurality of silicon photomultipliers (SiPMs)

monolithically integrated with a substrate. Each SiPM includes a plurality of single photon avalanche diodes (SPADs). In some embodiments, the plurality of SiPMs in the monolithic SiPM array could be arranged in a hexagonal or square array. In such scenarios, the plurality of SiPMs in the monolithic SiPM array could be arranged with a density of about 0.4 SiPMs per $mm^2$.

In some embodiments, the monolithic SiPM array further includes at least one isolation trench in the substrate, wherein the at least one isolation trench is arranged between neighboring SiPMs. Additionally or alternatively, the at least one isolation trench could be at least partially filled with at least one of: a metal material, an optically-opaque material, a conductive material, or a non-conductive material.

In some examples, the at least one isolation trench could provide electrical isolation between the neighboring SiPMs. Additionally or alternatively, the at least one isolation trench could provide optical isolation between the neighboring SiPMs.

Block 404 includes aligning an aperture array having a plurality of apertures with the monolithic SiPM array so as to define a plurality of receiver channels. Each receiver channel includes a respective SiPM of the plurality of SiPMs optically coupled to a respective aperture of the plurality of apertures.

In some embodiments, method 400 could further include positioning a baffle structure between the monolithic SiPM array and the aperture array. In some scenarios, the baffle structure could include a plurality of openings in an optically opaque material. Positioning the baffle structure could be performed such that each receiver channel is associated with a respective SiPM of the plurality of SiPMs being optically coupled to a respective aperture of the plurality of apertures via a respective opening in the baffle structure.

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, a physical computer (e.g., a field programmable gate array (FPGA) or application-specific integrated circuit (ASIC)), or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. An optical system comprising:
   a substrate;
   a plurality of light-detecting elements monolithically integrated with the substrate, wherein each light-detecting element comprises a plurality of detectors;
   an aperture array comprising a plurality of apertures, wherein the plurality of light-detecting elements and the aperture array are aligned so as to define a plurality of receiver channels, wherein each receiver channel comprises a respective light-detecting element of the plurality of light-detecting elements optically coupled to a respective aperture of the plurality of apertures; and
   a baffle structure, wherein the baffle structure comprises a plurality of openings in an optically opaque material, wherein the baffle structure is arranged between the aperture array and the plurality of light-detecting elements such that each receiver channel comprises a respective light-detecting element of the plurality of light-detecting elements optically coupled to a respective aperture of the plurality of apertures via a respective opening in the baffle structure.

2. The optical system of claim 1, wherein the substrate comprises a silicon wafer, an indium phosphide wafer, or a gallium arsenide wafer.

3. The optical system of claim 1, wherein each light-detecting element of the plurality of light-detecting elements comprises at least 1000 detectors.

4. The optical system of claim 1, wherein the plurality of light-detecting elements are arranged along the substrate in a hexagonal or square array.

5. The optical system of claim 1, wherein the plurality of light-detecting elements are arranged along the substrate with a density of about 0.4 light-detecting elements per $mm^2$.

6. The optical system of claim 1, further comprising a plurality of electrical conductors, wherein the plurality of electrical conductors is coupled to the plurality of light-detecting elements via at least one of: a through substrate via (TSV) or a side routing arrangement.

7. The optical system of claim 1, further comprising at least one isolation trench in the substrate, wherein the at least one isolation trench is arranged between neighboring light-detecting elements.

8. The optical system of claim 7, wherein the at least one isolation trench is at least partially filled with at least one of: a metal material, an optically-opaque material, a conductive material, or a non-conductive material.

9. The optical system of claim 7, wherein the at least one isolation trench provides electrical isolation or optical isolation between the neighboring light-detecting elements.

10. The optical system of claim 1, further comprising a plurality of optical waveguides, wherein each optical waveguide is configured to couple light into a respective light-detecting element of the plurality of light-detecting elements.

11. The optical system of claim 1, wherein a cross-section of the baffle structure comprises a plurality of diamond-shaped members separated by the respective openings in the baffle structure.

12. A method of manufacturing an optical system, the method comprising:
providing a monolithic light-detecting element array comprising a plurality of light-detecting elements monolithically integrated with a substrate, wherein each light-detecting element comprises a plurality of detectors;
aligning an aperture array comprising a plurality of apertures with the monolithic light-detecting element array so as to define a plurality of receiver channels, wherein each receiver channel comprises a respective light-detecting element of the plurality of light-detecting elements optically coupled to a respective aperture of the plurality of apertures; and
positioning a baffle structure comprising a plurality of openings in an optically opaque material between the monolithic light-detecting element array and the aperture array such that each receiver channel comprises a respective light-detecting element of the plurality of light-detecting elements optically coupled to a respective aperture of the plurality of apertures via a respective opening in the baffle structure.

13. The method of claim 12, wherein the plurality of light-detecting elements in the monolithic light-detecting element array are arranged in a hexagonal or square array.

14. The method of claim 12, wherein the plurality of light-detecting elements in the monolithic light-detecting element array are arranged with a density of about 0.4 light-detecting elements per $mm^2$.

15. The method of claim 12, wherein the monolithic light-detecting element array further comprises at least one isolation trench in the substrate, wherein the at least one isolation trench is arranged between neighboring light-detecting elements.

16. The method of claim 15, wherein the at least one isolation trench is at least partially filled with at least one of: a metal material, an optically-opaque material, a conductive material, or a non-conductive material.

17. The method of claim 15, wherein the at least one isolation trench provides electrical isolation between the neighboring light-detecting elements.

18. The method of claim 15, wherein the at least one isolation trench provides optical isolation between the neighboring light-detecting elements.

* * * * *